(12) United States Patent
Fernandes et al.

(10) Patent No.: US 11,171,200 B2
(45) Date of Patent: Nov. 9, 2021

(54) INTEGRATED CIRCUITS HAVING DIELECTRIC LAYERS INCLUDING AN ANTI-REFLECTIVE COATING

(71) Applicant: TEXAS INSTRUMENTS INCORPORATED, Dallas, TX (US)

(72) Inventors: Poornika Fernandes, Murphy, TX (US); David Matthew Curran, Plano, TX (US); Stephen Arion Meisner, Allen, TX (US); Bhaskar Srinivasan, Allen, TX (US); Guruvayurappan S. Mathur, Plano, TX (US); Scott William Jessen, Allen, TX (US); Shih Chang Chang, Allen, TX (US); Russell Duane Fields, Richardson, TX (US); Thomas Terrance Lynch, Allen, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 16/584,463

(22) Filed: Sep. 26, 2019

(65) Prior Publication Data

US 2021/0098565 A1   Apr. 1, 2021

(51) Int. Cl.
*H01L 49/02* (2006.01)
*H01L 21/02* (2006.01)

(52) U.S. Cl.
CPC .......... *H01L 28/60* (2013.01); *H01L 21/0214* (2013.01); *H01L 21/0217* (2013.01); *H01L 21/02164* (2013.01); *H01L 21/02274* (2013.01)

(58) Field of Classification Search
CPC ................. H01L 28/60; H01L 21/0214; H01L 21/02164; H01L 21/02274; H01L 21/0217
See application file for complete search history.

(56) References Cited

U.S. PATENT DOCUMENTS

| | | | | |
|---|---|---|---|---|
| 2002/0004271 A1* | 1/2002 | Weis | ................. | H01L 27/10864 438/243 |
| 2005/0118795 A1* | 6/2005 | Hidaka | ................. | H01L 27/105 438/593 |
| 2006/0205140 A1* | 9/2006 | Wofford | ................. | H01L 28/40 438/239 |

* cited by examiner

*Primary Examiner* — Su C Kim
(74) *Attorney, Agent, or Firm* — Jacqueline J. Garner; Charles A. Brill; Frank D. Cimino

(57) ABSTRACT

In some examples, an integrated circuit comprises a substrate; a first metal layer and a second metal layer positioned above the substrate; a first composite dielectric layer located on the first metal layer, wherein the first composite dielectric layer comprises a first anti-reflective coating; a second composite dielectric layer positioned on the second metal layer, wherein the second composite dielectric layer comprises a second anti-reflective coating; and a capacitor metal layer disposed over the first composite dielectric layer.

21 Claims, 9 Drawing Sheets

INTEGRATED CIRCUITS HAVING DIELECTRIC LAYERS INCLUDING AN ANTI-REFLECTIVE COATING

BACKGROUND

In many applications, such as future vehicles utilizing 48V electrical systems, analog circuits with capacitors should be designed to achieve a relatively high breakdown voltage, but yet have a relatively high capacitance density.

SUMMARY

In some examples, an integrated circuit comprises a substrate; a first metal layer and a second metal layer positioned above the substrate; a first composite dielectric layer located on the first metal layer, wherein the first composite dielectric layer comprises a first anti-reflective coating; a second composite dielectric layer positioned on the second metal layer, wherein the second composite dielectric layer comprises a second anti-reflective coating; and a capacitor metal layer disposed over the first composite dielectric layer.

In some examples, a method of forming an integrated circuit comprises forming first and second metal interconnect layers in a first horizontal level over a semiconductor substrate. The method also comprises forming a capacitor including the first metal interconnect layer, which includes: forming a first composite dielectric layer on the first metal interconnect layer; forming a capacitor dielectric layer on the composite dielectric layer; and forming a capacitor metal layer over the capacitor dielectric layer. The method also comprises forming an inter-layer dielectric (ILD) layer over the substrate such that the ILD contacts sidewalls of the first and second metal interconnect layers, and contacts top and sidewalls of the first composite dielectric layer.

BRIEF DESCRIPTION OF THE DRAWINGS

For a detailed description of various examples, reference will now be made to the accompanying drawings in which.

DETAILED DESCRIPTION

Figure 1A:
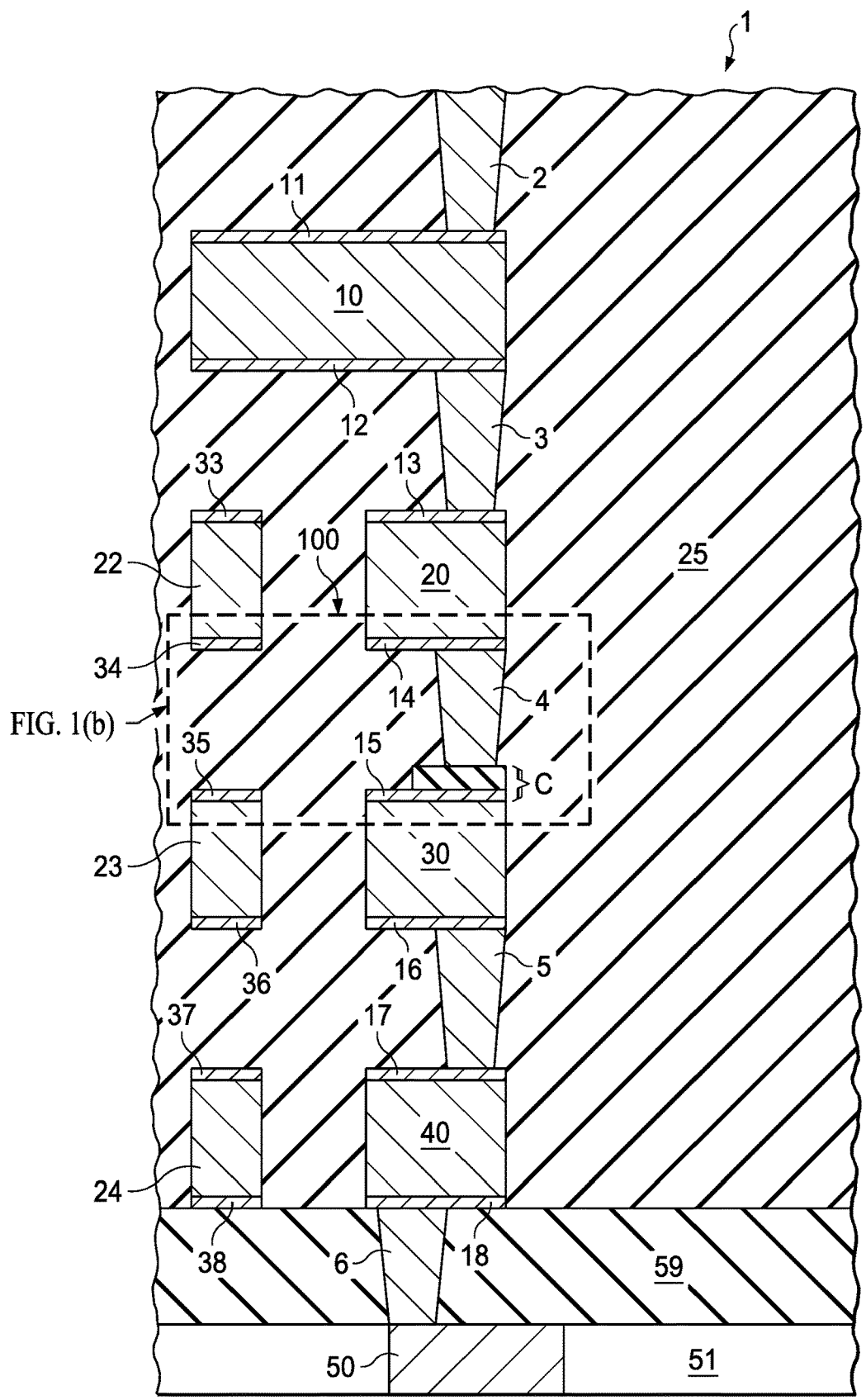
FIG. 1(a) is a cross-sectional diagram of an illustrative integrated circuit fabricated on a semiconductor substrate, in accordance with various examples.

Integrated circuits (ICs) are typically fabricated in large batches on a single semiconductor wafer of high quality (e.g., electronic grade) silicon (or other semiconductor material, e.g., gallium arsenide) using microfabrication processing techniques. ICs include microelectronic elements, such as transistors, and these microelectronic elements are coupled to each other using metal interconnect layers. These metal interconnect layers (sometimes referred to herein as metal layers) provide signal pathways between the microelectronic elements. In some cases, the metal layers are present at different horizontal levels that are vertically spaced relative to each other. The horizontal levels are present above the semiconductor wafer and connect through via structures, which are perpendicular trenches filled with a suitable metal.

In some cases, integrated circuits include capacitors that may be fabricated on one of the metal interconnect layers. These capacitors should meet the reliability requirements of a ratio stability of less than 0.00075% over 10 years; a voltage coefficient of less than 10 ppm/V; a temperature drift match of less than 0.05%/° C.; a dielectric absorption of less than 0.00075%; and a capacitance greater than 0.5 fF/$\mu m^2$. For some applications, e.g., automotive applications, it is desirable to minimize the circuit area and provide a high operating voltage (e.g., 45V). To achieve the capacitance requirements in such a case, a composite dielectric layer comprising multiple dielectrics may be employed. In one case, the composite dielectric layer includes a layer of silicon oxide, a layer of silicon nitride, and a layer of silicon oxide. However, this composite dielectric layer does not meet the capacitance requirements at the 130 nm technology node. At this technology node, the composite dielectric layer uses a thick silicon nitride to increase capacitance density, and it is difficult to use a thick dielectric film as an anti-reflective coating, which is generally employed for reflection control and light absorption during photolithography. Thus, an anti-reflective coating is necessary to pattern the underlying metal interconnect layer, particularly at 130 nm or lower technology node where a trade-off between critical dimension uniformity and capacitance breakdown voltage is observed.

Accordingly, methods and devices described in this disclosure employ a composite dielectric layer that includes multiple layers, where one of the multiple layers improves the critical dimension uniformity by acting as an anti-reflective layer/coating and also acts as a capacitor dielectric. In examples described herein, the anti-reflective coating is formed over the underlying metal interconnect layer. In some examples, the anti-reflective coating is formed on one or more dielectric layers, where the dielectric layers are formed on the underlying metal interconnect layer. The combination of the anti-reflective coating and the dielectric layers is selected so that the capacitor has a breakdown voltage that meets reliability requirements. In some examples, the composite dielectric layer includes a dielectric layer, such as an oxide layer, that is deposited over the anti-reflective coating and serves as an etch stop while forming the capacitor. In some examples, a capacitor metal layer including, for instance, titanium nitride is formed over the composite dielectric layer and serves as the other capacitor plate, where the metal interconnect layer serves as the other capacitor plate.

FIG. 1(a) is a cross-sectional diagram of an illustrative integrated circuit (IC) 1 fabricated on a semiconductor substrate 51. For ease of illustration, the semiconductor substrate 51 is shown as a block. From a fabricated IC standpoint, the semiconductor substrate 51 may further comprise a plurality of isolation features (not expressly shown in FIG. 1(a)), such as shallow trench isolation (STI) features or local oxidation of silicon (LOCOS) features. The isolation features define and isolate the various microelectronic elements (not expressly shown in FIG. 1(a)). Examples of the various microelectronic elements that may be formed in and/or on the semiconductor substrate 51 include transistors (e.g., metal oxide semiconductor field effect transistors (MOSFETs), complementary metal oxide semiconductor transistors (CMOS), bipolar junction transistors (BJT), high voltage transistors, high frequency transistors, p-channel and/or n-channel field effect transistors (PFETs/NFETs), etc.), resistors, diodes, and other suitable elements. One such microelectronic element is marked with reference 50 in FIG. 1(*a*). Various processes are performed to form the various microelectronic elements including deposition, etching, implantation, photolithography, annealing, and other suitable processes. The microelectronic elements fabricated in the semiconductor substrate 51 is covered with pre-metal dielectric layer 59 before metal interconnect layers are deposited. The microelectronic elements are interconnected using one or more of the metal interconnect layers 10, 20, 30, 40, 22, 23, and 24. An inter-level dielectric (ILD) 25 electrically isolates the metal interconnect layers 10, 20, 30, 40, 22, 23, and 24 from each other. While shown as a single material layer, the ILD 25 may be implemented as a number of dielectric material layers suitable to support the particular manufacturing scheme used to produce the IC 1. The metal interconnect layers 10, 20, 30, 40, 22, 23, and 24 may sometimes herein be referred to as metal layers 10, 20, 30, 40, 22, 23, and 24.

In some examples, the metal layers 10, 20, 30, 40, 22, 23, and 24 have respective layers 11, 13, 15, 17, 33, 35, and 37 disposed on their top sides. In some examples, the metal layers 10, 20, 30, 40, 22, 23, and 24 are disposed on respective layers 12, 14, 16, 18, 34, 36, and 38. In some examples, layers 12, 14, 16, 18, 34, 36, and 38 include titanium nitride or titanium/titanium nitride bilayer, which may prevent oxidation of the metal interconnect layer that will be deposited in the subsequent steps. In various examples the layers 11, 12, 13, 14, 15, 16, 17, 18, 33, 34, 35, 36, 37 and 38 may each include a metal barrier, e.g. TiN/Ti. In some examples the layers 11, 12, 13, 14, 15, 16, 17, 18, 33, 34, 35, 36, 37 and 38 may also include one or more dielectric layers that may act as an anti-reflective coating (ARC), e.g. a thin layer of SiON. The ARC, if used, may be appropriate on metal levels for which patterning benefits from the suppression of optical reflections during exposure of a photoresist. On levels with sufficient spacing between metal features, the ARC may not be needed. In other examples, at least one of the layers 11, 13, 15 and 17 includes one or more dielectric sublayers that act as capacitor element between respective underlying and overlying metal interconnect layers. Examples of such capacitors are described ahead in FIG. 1(*b*). The following description assumes without implied limitation that the layer 15 implements a capacitor.

The metal layers 24 and 40 are positioned on the same horizontal level, and this horizontal level is referred herein as MET 1 level. Before the metal layers 24, 40 were separate units, a continuous bottom barrier metal layer, e.g. TiN/Ti, (not shown) was deposited on the pre-metal dielectric layer 59, a continuous metal layer, e.g. Al/0.5% A Cu, was formed on the barrier metal layer, and a continuous top barrier metal layer, e.g. TiN/Ti, was formed on the continuous metal layer. If needed an ARC was formed on the top barrier metal layer. This continuous stack was patterned to form the metal layers 24 and 40 and layers 17, 18, 37 and 38. Some of the metal layers present on the MET 1 level couple, e.g. conductively connect, to the microelectronic elements fabricated in the semiconductor substrate 51 through corresponding via structures. For example, via structure 6 connects the element 50 to the metal layer 40.

The metal layers 23 and 30 (and corresponding layers 15, 16, 35 and 36) are disposed on a horizontal level—the second level of the metal layers (or "MET2 level")—that is above the MET 1 level. These conductive structures may be formed in a similar manner to that described for the MET 1 level. As further described below, in the present example the layer 15 includes additional dielectric layers that implement a capacitor C between the via 4 and the metal layer 30. Some of the metal layers present on the MET 2 level couple, e.g. conductively connect, to a microelectronic element such as the element 50 formed in and/or on the semiconductor substrate 51. The coupling may be through a connection formed by a combination of one or more via structures and metal layers. For example, the metal layer 30 couples to the element 50 through via structure 5 that couples to the metal layer 40, which further couples to the element 50 through the via structure 6.

Another metal level is implemented by metal layers 22 and 20 that are disposed in the ILD 25 and are present on the same horizontal level. This horizontal level can be referred to as a third level of the metal layers (or "MET 3 level"). These conductive structures may also be formed in a similar manner to that described for the MET 1 level. Some of the metal layers present on the MET 3 level couple, e.g. conductively connect, to a microelectronic element such as the element 50 formed in and/or on the semiconductor substrate 51. The coupling may be by a connection formed by a combination of one or more via structures and metal layers. In the present example, the coupling of the MET 3 layer 20 includes capacitive coupling through the capacitor C.

The metal layer 10 is disposed in the ILD 25 and is present on a horizontal level that is a fourth level of the metal layers (or "MET 4 level"). Only a single metal layer is shown the present example. The spacing of the metal layer 10 to other metal layers at the MET 4 level maybe sufficient that no ARC is needed to pattern this level. The metal layer 10 couples, e.g. conductively connects, to the metal layer 20 by the via structure 3. Due to the presence of the capacitor C in the path to the element 50, the coupling of the metal layer 10 to the element 50 is primarily capacitive. The metal layer 10 may be coupled to a top metal layer (not shown) through via structure 2. The top metal layer may further couple to other conducting paths to connect to a power source (not shown) and act as a voltage source for the microelectronic elements (represented here as the element 50). The example depicted in FIG. 1(*a*) shows four levels of metal layers, e.g., MET 1, 2, 3, and 4 levels. However, in other examples, the number of levels may vary. The metal layers 22, 23, and 24 are shown in isolation. However, in various examples the metal layers 22, 23, 24 may conductively connect to one or more metal features in a same or different interconnect level through structures that are not expressly shown in FIG. 1(*a*) to realize a particular electric circuit.

Refer now to FIG. 1(*b*), which depicts an area 100 marked in FIG. 1(*a*). The area 100 shows the capacitor C (FIG. 1(*a*)) in detail. Portions of metal layers 20, 22, 23 and 30 are shown as metal layers 120, 122, 123 and 104, respectively. The capacitor C, in one example, includes the metal layers 104 and 114. The capacitor C also includes the layer 15 which in the present example includes dielectric layers 106, 108 and 110, which form a composite dielectric layer that may be referred to as composite dielectric layer 15. The area 100 further depicts a portion of the ILD 25 of FIG. 1(*a*) as ILD 125 in FIG. 1(*b*). As will be further evident in method 200 (FIG. 2, below), the layer 35 forms another composite dielectric layer that may be referred to as composite dielectric layer 35, where the chemical composition of the dielectric layers 131, 132, and 133 is similar to the chemical composition of the dielectric layers 106, 108, and 110, respectively. The composite dielectric layers 15 and 35 also include an anti-reflective coating, e.g., dielectric layers 108 and 132, respectively. In this view, any metal barrier layers, that may be present respectively between the composite dielectric layers 15 and 35 and the metal layers 104 and 123, are omitted for clarity. If present, such metal barrier layers may be considered part of the metal layer 104 or the metal layer 123.

Figure 1B:
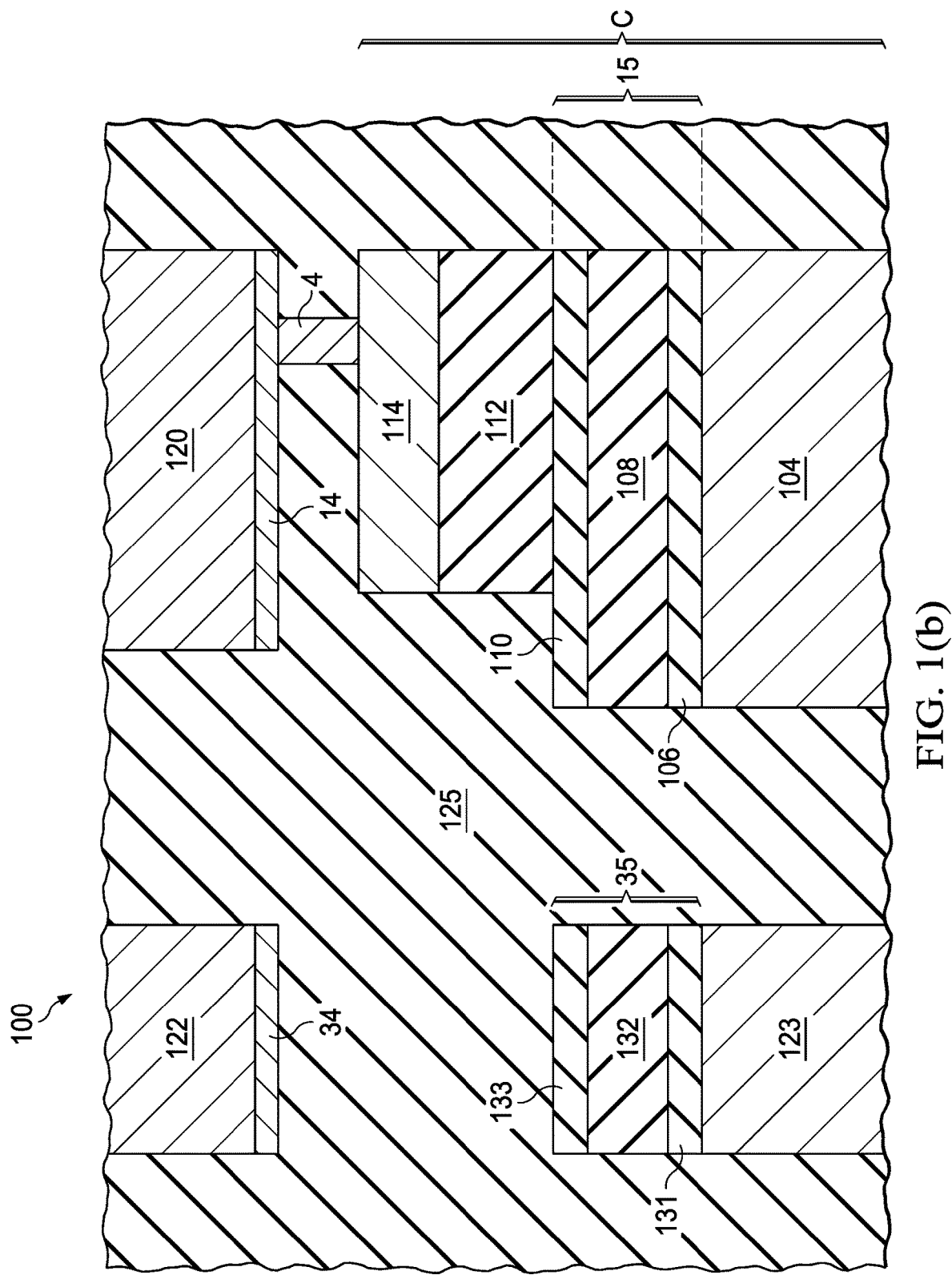
FIG. 1(b) depicts a portion of the integrated circuit shown in FIG. 1(a), in accordance with various examples.

As noted above, the composite dielectric layer 15 of FIG. 1(a) forms the capacitor C with underlying metal layer 30. FIG. 1(b) depicts the layers present in the layer 15 that realizes such a capacitor. For example, metal layers 114 and 104 respectively form the top and bottom plates of the capacitor. The capacitor C includes the composite dielectric layer 15 including the dielectric layers 106, 108 and 110, and a capacitor dielectric layer 112. The composite dielectric layer 15 and the capacitor dielectric layer 112 may be referred to in the aggregate as a composite dielectric layer. The metal layer 114 may be limited to being formed only on or over the capacitor dielectric layer 112, and may be referred to herein as capacitor metal layer 114. In various examples the capacitor metal layer 114 has a same "footprint" as the capacitor dielectric layer 112, meaning the capacitor metal layer 114 and the capacitor dielectric layer 112 share a common lateral extent or perimeter.

In one example, the capacitor metal layer 114 includes titanium nitride, and the metal layer 104 includes an alloy of aluminum and copper, e.g. 0.5% Cu. In other examples, the capacitor metal layer 114 includes tantalum/tantalum nitride or tungsten/tungsten nitride. In one example, the dielectric layers 106, 110 include silicon dioxide, the capacitor dielectric layer 112 includes silicon nitride, and the dielectric layer 108 includes silicon oxynitride, where silicon oxynitride acts both as an insulating layer of the capacitor and an anti-reflective coating for patterning interconnects at the metal level of which the metal layers 104 and 123 are formed, e.g. MET 2. For example, each of the dielectric layers 106, 108, 110 and 112 has a dielectric permittivity $\varepsilon_r \varepsilon_0$ about equal to $\sqrt{n}$, where e is the permittivity of free space, $\varepsilon_r$ is the relative permittivity of the layer, and n is the refractive index of that layer. Thus the dielectric layers 106 and 110 may have a relative permittivity $\varepsilon_{r1}$, the dielectric layer 108 may have a permittivity $\varepsilon_{r2}$, and the capacitor dielectric layer 112 may have a permittivity $\varepsilon_{r3}$. The capacitance of the capacitor C will in general be a function of $\varepsilon_{r1}$, $\varepsilon_{r2}$ and $\varepsilon_{r3}$, and the thicknesses of the dielectric layers 106, 108, 110 and 112. While the permittivity of each of these layers may vary with formation process conditions and precise stoichiometry, PECVD silicon dioxide may have a relative permittivity of about 4, PECVD silicon oxynitride may have a relative permittivity of about 6-8, and PECVD silicon nitride may have a relative permittivity of about 7.

The area 100 further comprises the metal layers 120, 122 that are disposed within the ILD 125. The metal layers 120, 122 are respectively formed on the layers 14, 34. The metal layer 120 is conductively connected to the capacitor metal layer 114 through the via structure 4. The metal layers 120, 122 include, in one example, an alloy of aluminum and copper. As further described below in detail, the resulting capacitor includes the anti-reflective coating (e.g., the dielectric layer 108) as a dielectric and helps to pattern the underlying metal interconnect layer to form the metal layers 123 and 104. As further described below, dielectric layers 133, 110 are formed from a single layer; the dielectric layers 132, 108 are formed from another single layer; and the dielectric layers 131, 106 are formed from yet another single layer. In effect, the dielectric layers 131 and 133 have the same chemical composition as the dielectric layers 106 and 110, and the dielectric layer 132 has the same chemical composition as the dielectric layer 108. An anti-reflective coating that serves as a precursor to the dielectric layers 108 and 132 may further facilitate fabricating other structures, such as a via structure (not expressly shown in FIG. 1(b)) that may connect the metal layers 123, 104 with other metal layers and circuit components.

The chemical composition of the dielectric layer 110 may be chosen such that it acts as an etch stop during fabrication. Thus, in examples where the dielectric layer 110 includes silicon dioxide, the dielectric layer 110 serves as an etch stop to protect the dielectric layer 108 from the etch process that patterns the silicon nitride capacitor dielectric layer 112. In some examples, the dielectric layer 110 including silicon oxide has a thickness in a range of 13 nm to 17 nm. In some examples, the thicknesses of the dielectric layers 106, 108 and 110, and the index of refraction of the dielectric layer 108, can be selected to achieve high photo-lithography patterning fidelity. The dielectric layer 108 serving as an anti-reflective coating helps in achieving a critical dimension (CD) when fabricating various circuit components, such as, for example, in achieving a relatively high capacitance density of about 0.4 fF/$\mu m^2$. To achieve high critical dimensional performance, the dielectric layer 108 including silicon oxynitride has a thickness in a range of 25 nm to 40 nm. In such examples, the dielectric layer 108 may have an index of refraction in a range of between about 1.7 and about 2.1. Since the dielectric layers 106 and 108 are optimized together, the dielectric layer 106 including silicon dioxide has a thickness of about 2.5 nm to 10 nm. In some examples, the dielectric layer 110 also includes silicon dioxide and has a thickness of about 10 nm to 20 nm.

The thickness of the capacitor dielectric layer 112 can be selected to provide for sufficient breakdown voltage of the resulting capacitor. Future vehicles may employ a 48 V electrical system, so capacitors are expected to have a relatively high breakdown voltage. In some examples, the capacitor dielectric layer 112 includes silicon nitride and has a thickness in a range of 80 nm to 120 nm. In such examples, the silicon nitride capacitor dielectric layer 112 may have an index of refraction in a range between about 2.3 and about 2.9. In some examples, the capacitor metal layer 114 includes titanium nitride and has a thickness in a range of 100 nm to 180 nm.

Figure 2:
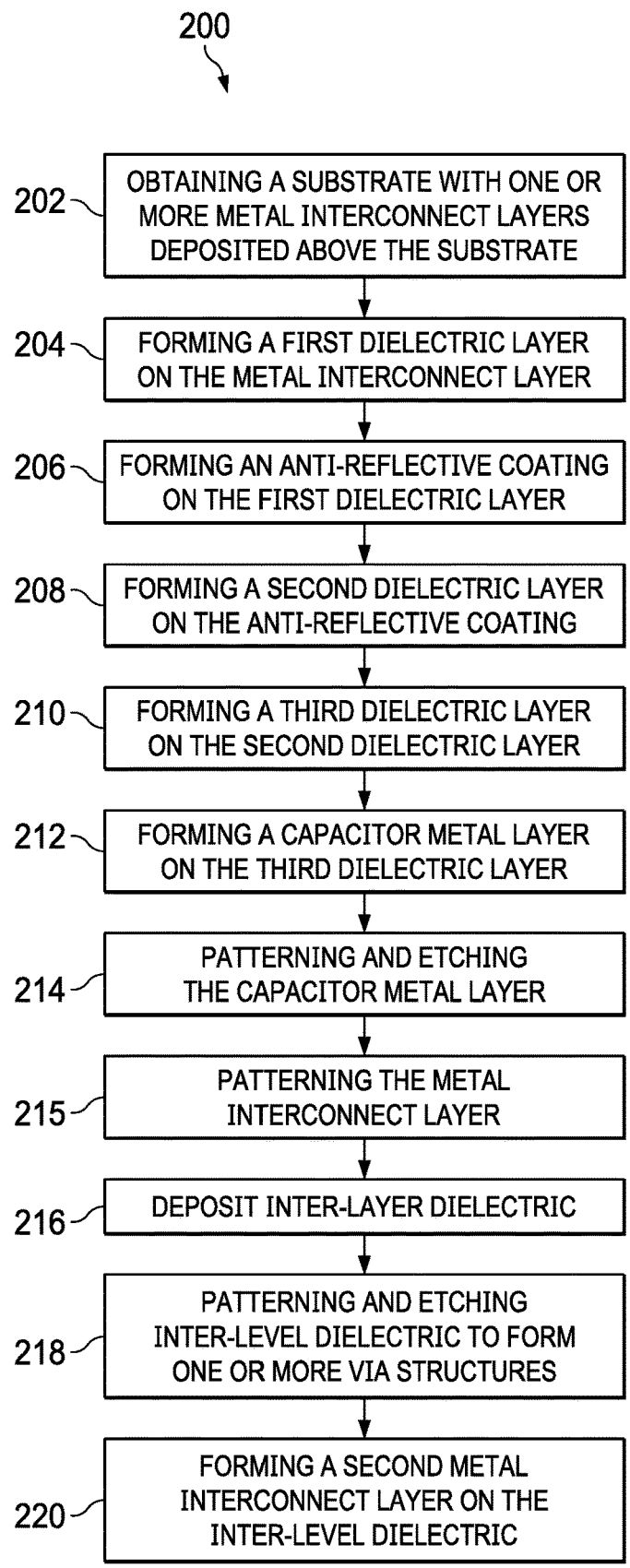
FIG. 2 shows a method to fabricate a capacitor, in accordance with various examples.

Referring now to FIG. 2, an illustrative method 200 is shown. The method 200 describes the fabrication steps that may be performed to form the capacitor C described in FIG. 1(b). The method 200 also describes the use of an anti-reflective coating, both as a capacitor dielectric and an anti-reflective material. In one example, patterning the underlying metal interconnect layer forms patterned layers, such as the metal layers 123 and 104 of FIG. 1(b). The method 200 is described in tandem with FIGS. 3(a)-(n).

Figure 3A:
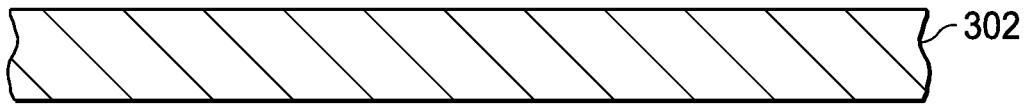
FIG. 3(a) through FIG. 3(n) shows a method, in accordance with various examples.
Figure 3B:
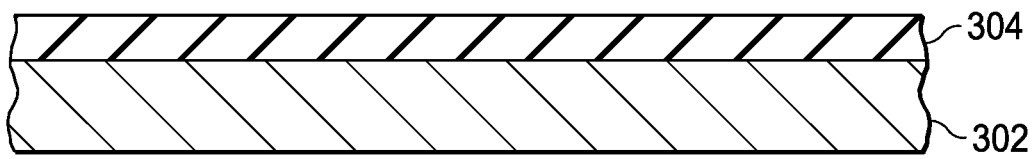

The method 200 begins with step 202 that includes obtaining a substrate with one or more metal interconnect layers deposited over the substrate. Now refer to FIG. 3(a) that depicts a metal interconnect layer 302. For illustration's purposes, the metal interconnect layer 302 can be thought to be present in the MET 2 level, and in such examples, the metal interconnect layer 302 is deposited on an interdielectric layer (not expressly shown in FIG. 3(a)), similar to the ILD 25. For simplicity sake, FIGS. 3(a)-3(n) depict the fabrication steps performed on the metal interconnect layer 302 and FIGS. 3(a)-3(n) do not explicitly show the different layers that may be present below the metal interconnect layer 302. The metal interconnect layer 302 may be formed (or fabricated) using sputtering or chemical vapor deposition (CVD) technique. In some examples, the metal interconnect layer 302 may include an alloy of aluminum and copper.

The steps involved in forming a capacitor on the substrate are now described. The method 200 then moves to step 204 (FIG. 3(b)) that includes forming a composite dielectric layer. A first dielectric layer 304 is positioned on the metal interconnect layer 302. In one example, the first dielectric layer 304 includes silicon dioxide. In some example, this silicon dioxide layer may be deposited using plasma enhanced chemical vapor deposition (PECVD) using a relatively low deposition temperature of about 350 degrees C. The PECVD process employs a PECVD chamber, where the PECVD pressure is controlled to about 8 Torr (about 1066 Pa), with a silane ($SiH_4$) gas flow of about 42 sccm, helium (He) gas flow of about 8000 sccm, and nitrogen oxide ($N_2O$) gas flow of about 1400-1450 sccm. A high frequency RF power set is at about 312 W. This illustrative PECVD process provides a silicon dioxide film (e.g., $Si_xO_y$, where X is approximately 1 and Y is approximately 2 in one example).

Figure 3C:
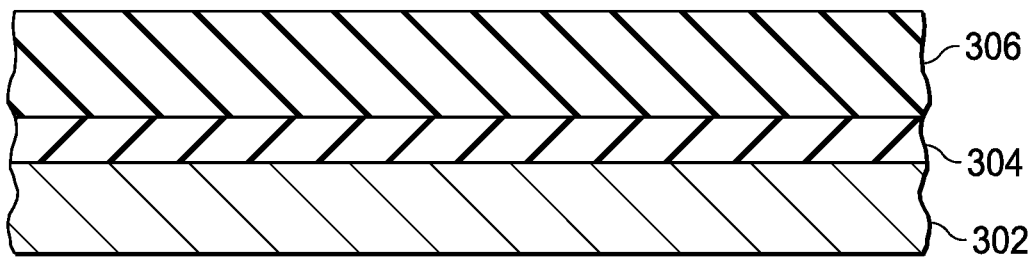

Method 200 further proceeds to step 206 (FIG. 3(c)) that includes further forming an anti-reflective coating 306 on the first dielectric layer 304. In one example, the anti-reflective coating includes silicon oxynitride. In one example, the silicon oxynitride layer is deposited using PECVD at a deposition temperature of about 350 degrees C. The chamber pressure is controlled to about 5.5 Torr (about 733 Pa), with a silane ($SiH_4$) gas flow of about 297 sccm, helium (He) gas flow of about 9000 sccm, and nitrogen oxide ($N_2O$) gas flow of about 650-700 sccm. The high frequency RF power is set at about 205 W.

Figure 3D:
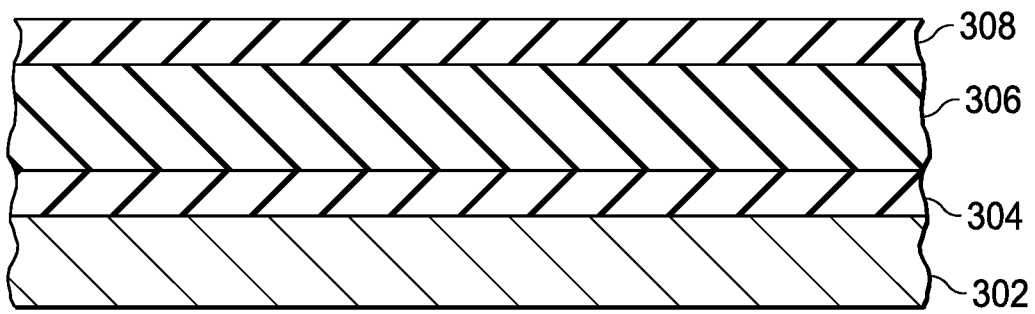

Following the step 206, method 200 proceeds to a step 208 that includes forming, using PECVD, a second dielectric layer 308 (FIG. 3(d)) on the anti-reflective coating 306. The first and second dielectric layers 304, 308 and the anti-reflective coating 306 may constitute the composite dielectric layer. In one example, the second dielectric layer 308 may include silicon dioxide, and this silicon dioxide may be deposited using the PECVD chamber set at 350 degrees C. The chamber pressure may be controlled at 8 Torr with the silane (SiH) gas flow of about 42 sccm, helium (He) gas flow of about 8000 sccm, and nitrogen oxide ($N_2O$) gas flow of about 1400-1450 sccm. The high frequency RF power may be set at about 312 W.

Figure 3E:
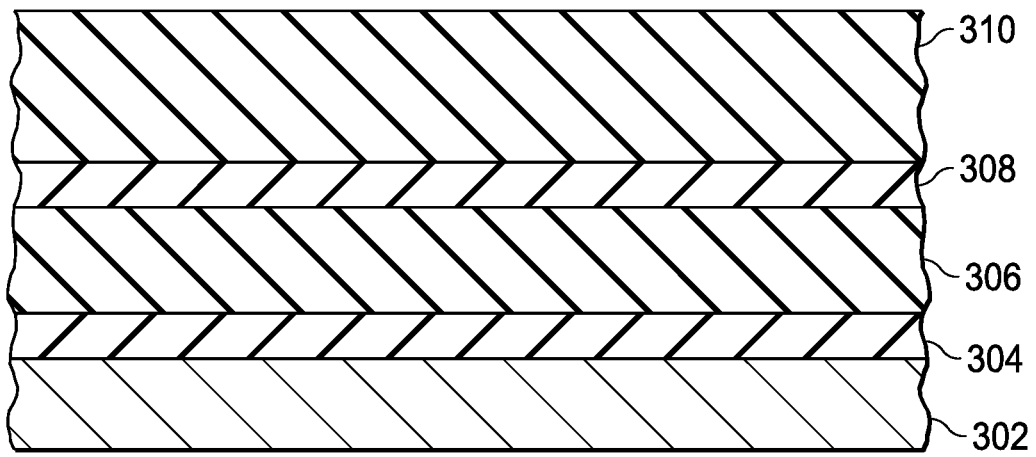

Method 200 then proceeds to step 210 that includes forming a third dielectric layer 310 (FIG. 3(e)) on the second dielectric layer 308. The third dielectric layer 310 constitutes the capacitor dielectric layer. In one example, the third dielectric layer 310 includes silicon nitride. In some examples, the silicon nitride layer is deposited using PECVD process using a PECVD chamber set at about 350 degrees C. with a chamber pressure of 5 Torr, the silane ($SiH_4$) gas flow of about 80 sccm, ammonia gas ($NH_3$) flow of about 540 sccm, and nitrogen ($N_2$) gas flow of about 9000 sccm. The high frequency RF power may be set at about 500 W.

The preceding process parameter values are nominal values. In various examples within the scope of the disclosure, each of the process parameter values may vary from the stated nominal value by ±10% with acceptable results. It may be more preferable to select the process parameter values within a range of ±5% of the nominal values. It may be more preferable to select the process parameter values essentially equal to the nominal values, e.g. within ±1%.

Figure 3F:
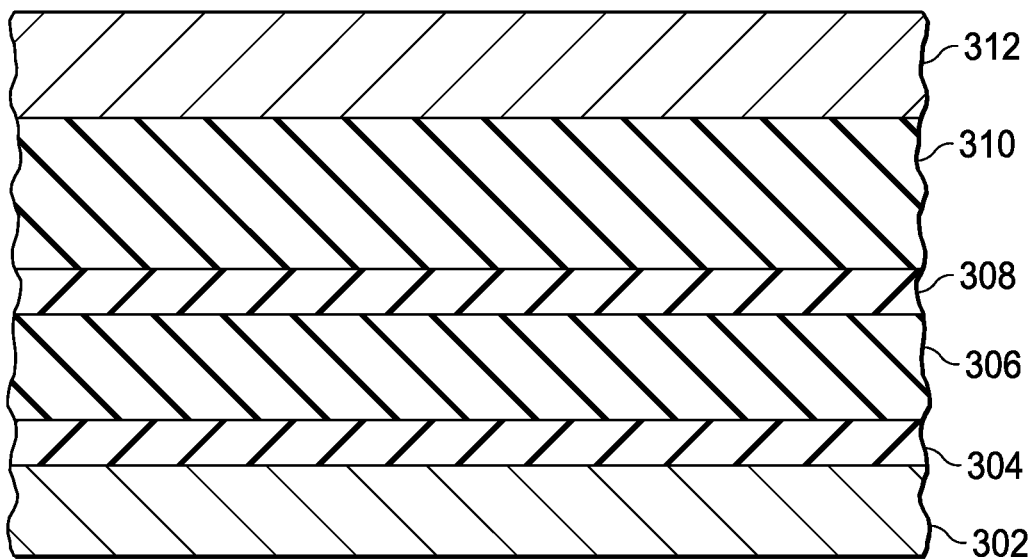
Figure 3G:
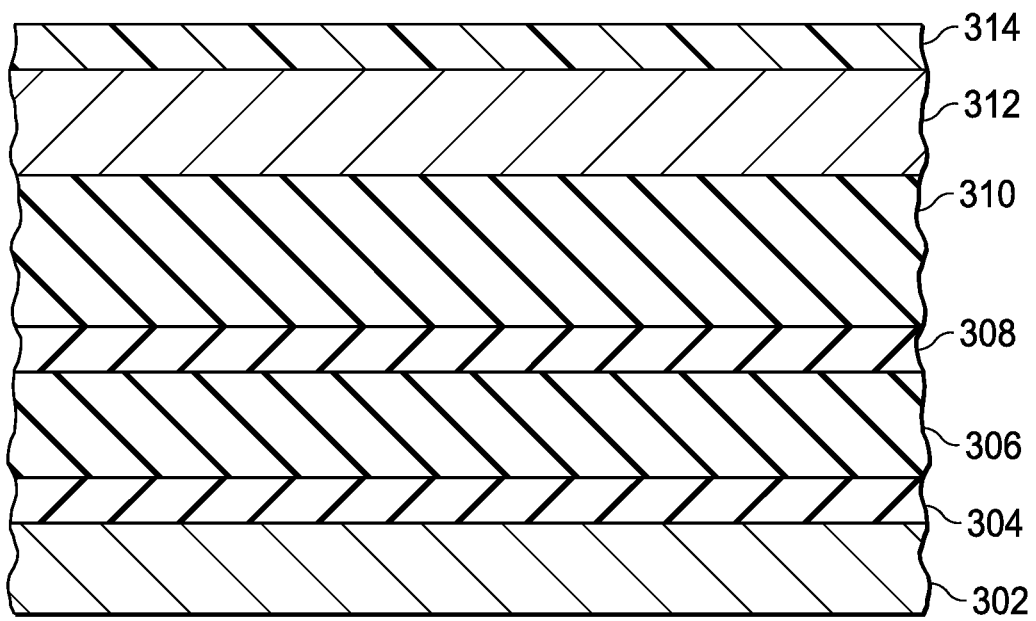
Figure 3H:
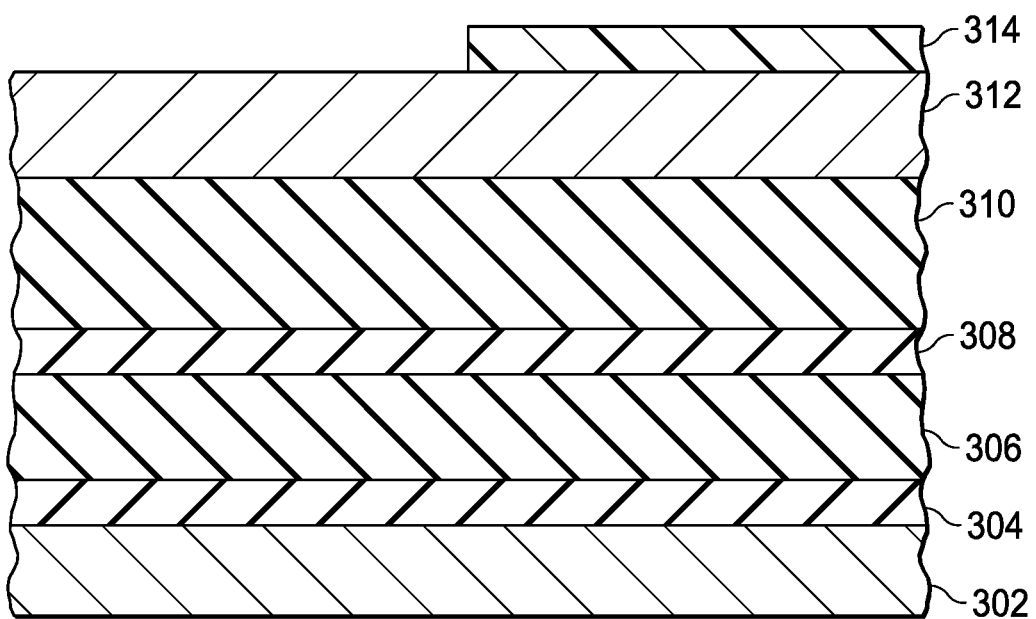

Method 200 then proceeds to step 212 (FIG. 3(f)) that includes forming, using sputtering or CVD technique, a capacitor metal layer 312 on the third dielectric layer 310, which is the part of the composite dielectric layer. In one example, the capacitor metal layer 312 includes titanium nitride. Method 200 further proceeds to step 214 that includes patterning and etching the capacitor metal layer 312 and the third dielectric layer 310 to form a capacitor. The patterning and etching described in the step 214 may include first depositing photoresist 314 (FIG. 3(g)) on the capacitor metal layer 312. The photoresist 314 is illuminated in a photolithography process so that a portion of the photoresist 314 is exposed and then stripped away (FIG. 3(h)), which further exposes a portion of the capacitor metal layer 312. In a non-limiting example, the photoresist 314 may be illuminated by a 193 nm optical source. Those skilled in the pertinent art will appreciate that the dielectric stack including the layers 304, 306, 308, 310 and 312 may reflect a portion of the incident optical energy. The reflectivity is expected to be a function of the thickness and refractive index of each layer within the dielectric stack. Appropriate selection of the thicknesses of these layers, and where possible the refractive indexes, can reduce the amount of reflected light, and thereby reduce standing wave patterns or optical interference that can reduce the fidelity of the pattern formed in the photoresist. In the absence of the anti-reflective coating 306 the dielectric stack may reflect sufficient light to cause such patterning issues. The addition of the anti-reflective coating 306 is expected to result in a reflectivity of the stack that is small enough to have a manageable or even negligible impact on patterning the photoresist 314.

Figure 3I:
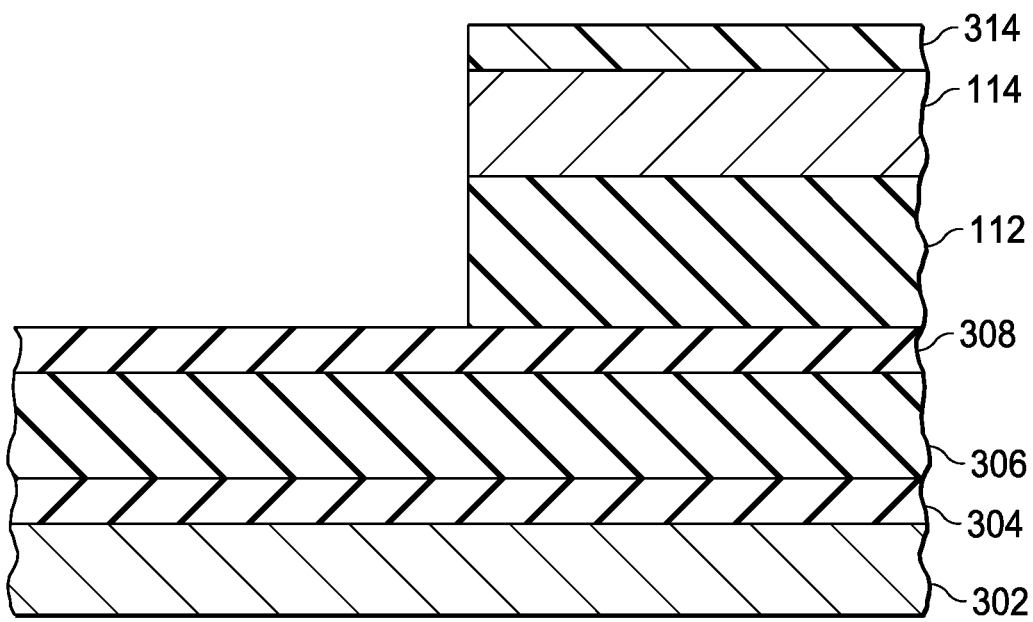

The portion of the capacitor metal layer 312 not covered by the photoresist 314 is etched, and the etching stops at the second dielectric layer 308, which acts as an etch stop. The third dielectric layer 310 and the capacitor metal layer 312, after being etched, form layers 112 and 114, respectively (FIG. 3(i)). The photoresist 314 is shown to be stripped away in FIG. 3(j). The capacitor dielectric layer 112, second dielectric layer 308, anti-reflective coating 306, and the first dielectric layer 304 serve as a capacitor dielectric, where the plates of the resulting capacitor comprise the capacitor metal layer 114 and the metal interconnect layer 302.

Figure 3J:
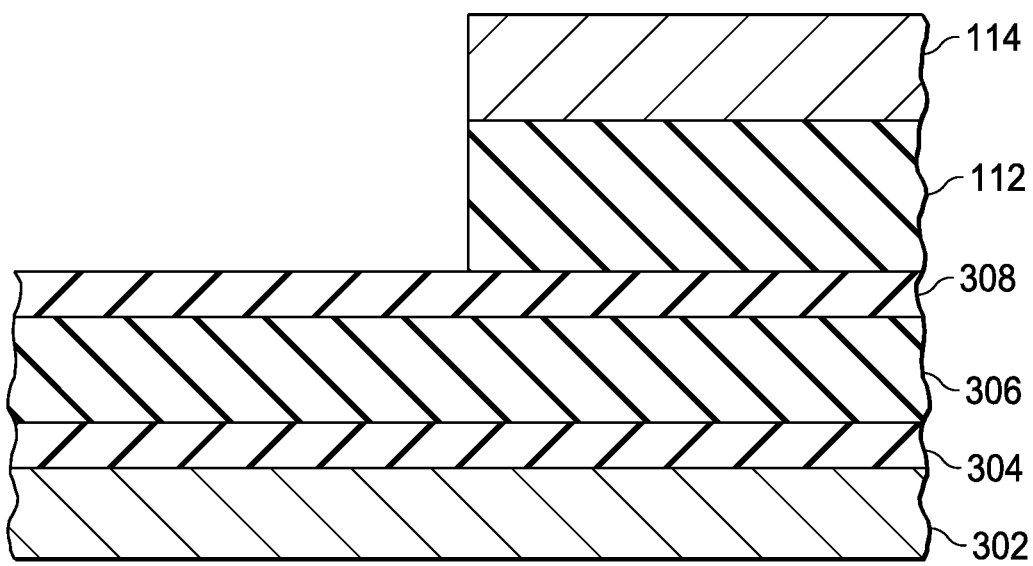
Figure 3K:
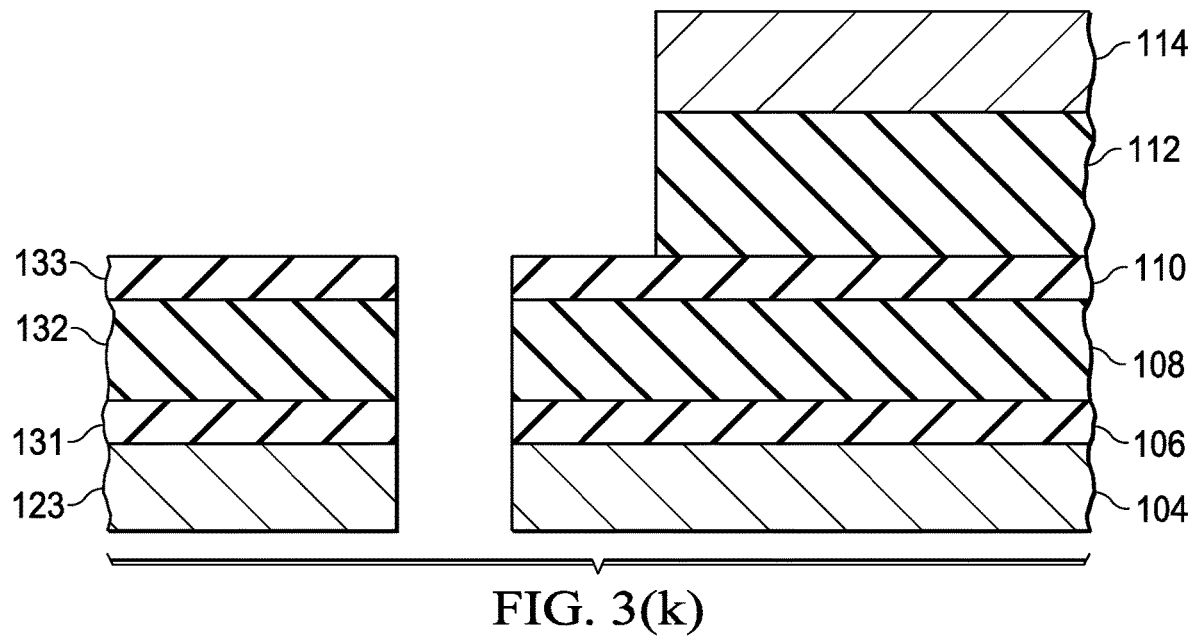

Following the step 214, method 200 proceeds to step 215 that includes patterning the metal interconnect layer 302 (FIG. 3(j)) to form metal layers 123, 104 (FIG. 3(k)). As noted above, the presence of the anti-reflective coating 306 enables improving the CD, improving the capacitance, and patterning the metal interconnect layer 302 by not reflecting the light used during photolithography. Before patterning, a dry film or a photoresist film is deposited (not expressly shown) on the surface of the capacitor metal layer 114 and the second dielectric layer 308 (FIG. 3(j)) using a suitable coating process, which is followed by curing, descum, and the like, which is further followed by photolithography technology and/or etching processes, such as a dry etch and/or a wet etch process, to expose the surface of the second dielectric layer 308 that may be etched. The exposed portion is etched to form dielectric layers 133, 110; dielectric layers 132, 108; dielectric layers 131, 106; and metal layers 123, 104 (FIG. 3(k)). The dielectric layers 106, 108, 110 and 112 act as the dielectric medium of the parallel plate capacitor including the metal layers 104 and 114. The dielectric layer 108, a remnant of the anti-reflective coating 306, is thus a portion of the capacitor dielectric.

Figure 3L:
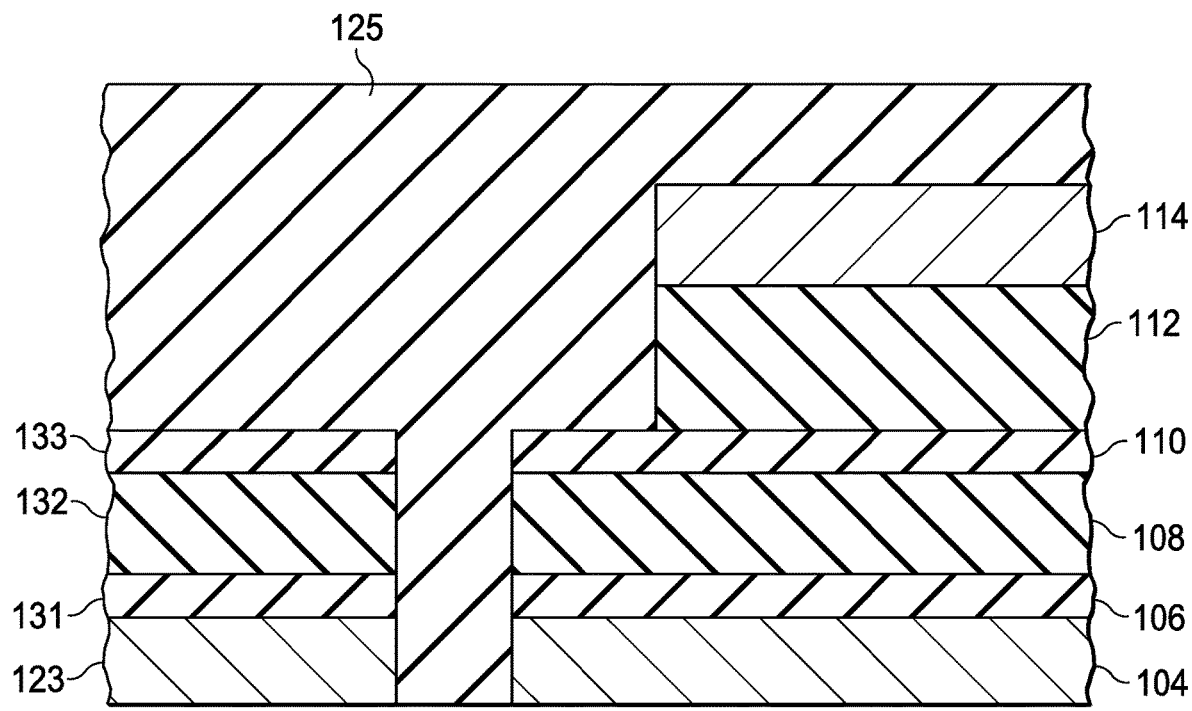
Figure 3M:
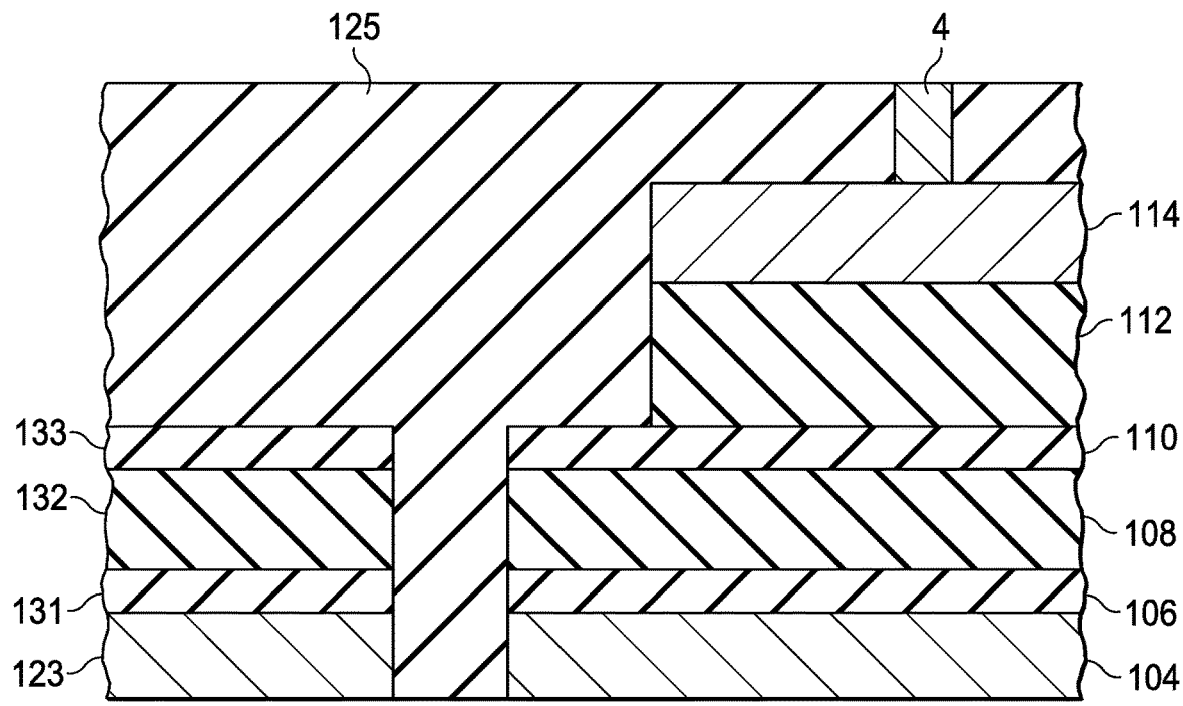
Figure 3N:
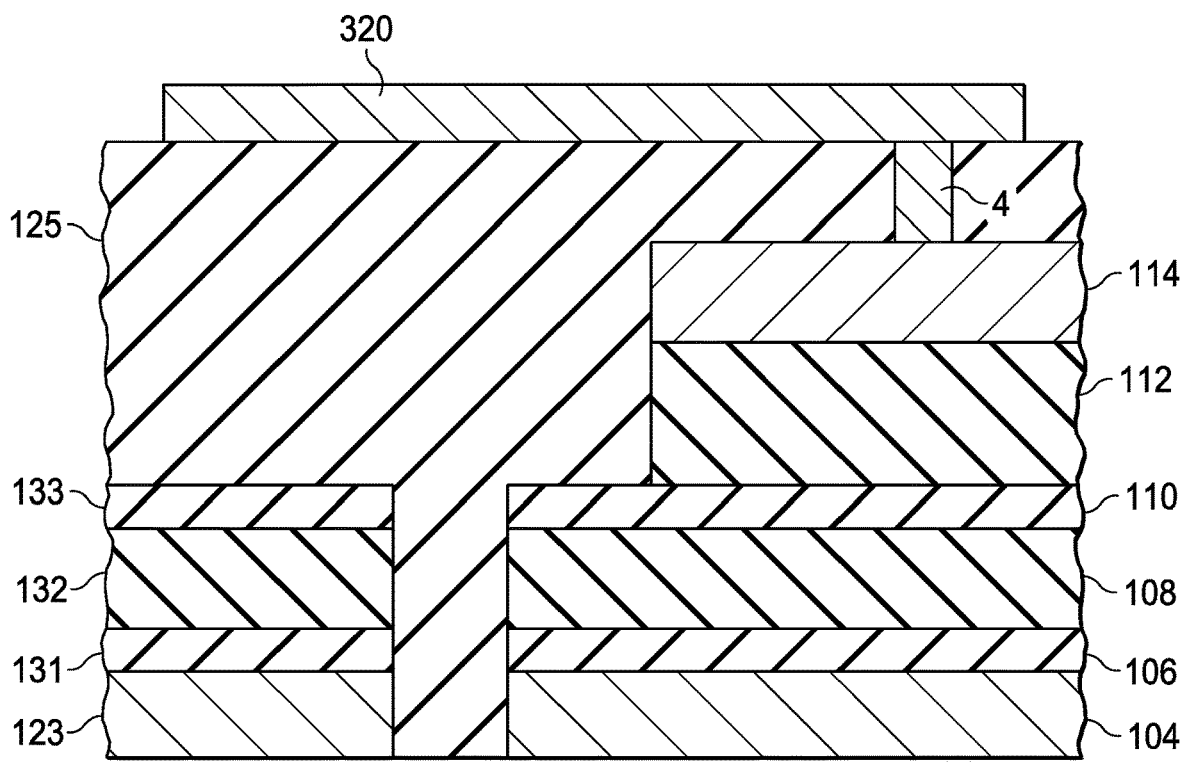

Method 200 then proceeds to step 216 that includes depositing, using a CVD process, an inter-level dielectric 125 (FIG. 3(l)). The inter-level dielectric 125 is deposited such that it comes in contact with the exposed portions. For example, the inter-level dielectric 125 is in contact with the top side and sidewalls of the layers 114, 110, 133. The inter-level dielectric 125 is also in contact with the sidewalls of the layers 132, 131, 123, 104, 106, 108, and 112. In one example, the inter-level dielectric 125 includes high-density density plasma grown silicon dioxide. In some examples, the metal layers 123, 104, and layer 114 may connect to other metal interconnect layers and, further electrically connect to other electrical components in the integrated circuit. This electrical connection is made using via structures, which may be formed by patterning and etching the inter-level dielectric 125. In effect, in some examples, the method 200 may further proceed to step 218 that includes patterning and etching the inter-level dielectric 125 to form one or more via structures (FIG. 3(m)). The example shown in FIG. 3(m) shows via structure 4 that is in contact with the capacitor metal layer 114, and in other examples, additional via structures may be formed. Following the formation of the via structure(s), the method 200 proceeds to a step 220 that includes forming a second metal interconnect layer 320 on the inter-level dielectric 125 (FIG. 3(n)).

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means+/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. An integrated circuit, comprising:
a substrate;
a first metal layer and a second metal layer positioned above the substrate;
a first composite dielectric layer located on the first metal layer, wherein the first composite dielectric layer comprises a first anti-reflective coating between first and second silicon oxide layers;
a second composite dielectric layer positioned on the second metal layer, wherein the second composite dielectric layer comprises a second anti-reflective coating;
a capacitor dielectric located on the second silicon oxide layer of the first composite dielectric layer; and
a capacitor metal layer disposed on the capacitor dielectric.

2. The integrated circuit of claim 1, wherein the capacitor dielectric and the capacitor metal layer share a same perimeter.

3. The integrated circuit of claim 1, wherein the capacitor metal layer comprises titanium nitride.

4. The integrated circuit of claim 1, wherein the first and second anti-reflective coatings comprise silicon oxynitride.

5. The integrated circuit of claim 1, wherein the first and second anti-reflective coatings have an index of refraction in a range of 1.7 to 2.1.

6. The integrated circuit of claim 1, wherein the first and second anti-reflective coatings have a thickness in a range of 30 nm to 32 nm.

7. The integrated circuit of claim 1, wherein the capacitor dielectric comprises a silicon nitride layer and the first composite dielectric layer includes the first anti-reflective coating comprising silicon oxynitride between the first and second silicon oxide layers.

8. The integrated circuit of claim 7, wherein the silicon nitride layer has a thickness in a range of 80 nm to 120 nm and the first anti-reflective coating has a thickness in a range of 30 nm to 32 nm.

9. The integrated circuit of claim 7, wherein
the first anti-reflective coating has an index of refraction in a range of 1.7 to 2.1; and
the silicon nitride layer has an index of refraction in a range of 2.3 to 2.9.

10. The integrated circuit of claim 1, wherein the capacitor dielectric layer comprises a silicon nitride layer, and the silicon nitride layer is located directly on the second silicon oxide layer.

11. A method of forming an integrated circuit, comprising:
forming first and second metal interconnect layers in a first horizontal level over a semiconductor substrate;
forming a capacitor including the first metal interconnect layer, including:
forming a first composite dielectric layer on the first metal interconnect layer, wherein the first composite dielectric layer comprises an anti-reflective coating between first and second dielectric layers;
forming a capacitor dielectric layer on second dielectric layer of the composite dielectric layer, wherein the capacitor dielectric layer has a thickness greater than a thickness of the first composite dielectric layer; and
forming a capacitor metal layer over the capacitor dielectric layer; and
forming an inter-layer dielectric (ILD) layer over the substrate such that the ILD contacts sidewalls of the first and second metal interconnect layers, and contacts top and sidewalls of the first composite dielectric layer.

12. The method of claim 11, further comprising forming a second composite dielectric layer on the second metal interconnect layer, wherein the ILD contacts top and sidewalls of the second composite dielectric layer.

13. The method of claim 12, wherein the first and second dielectric layers include silicon dioxide.

14. The method of claim 13, wherein the capacitor dielectric layer includes silicon nitride.

15. The method of claim 12, wherein the anti-reflective coating includes silicon oxynitride.

16. The method of claim 11, wherein:
the first dielectric layer comprises a first silicon dioxide layer located on the first metal interconnect layer;
the anti-reflective layer comprises a silicon oxynitride layer located on the first silicon dioxide layer; and
the second dielectric layer comprises a second silicon dioxide layer located on the silicon oxynitride layer; and
the capacitor dielectric layer comprises a silicon nitride layer formed on the second silicon dioxide layer.

17. The method of claim 15, wherein the anti-reflective coating has a thickness in a range of 25 nm to 40 nm.

18. The method of claim 14, wherein the capacitor dielectric layer has the thickness in a range of 80 nm to 120 nm.

19. The method of claim 11, further comprising forming a third interconnect layer over the first interconnect layer and conductively connecting the third interconnect layer to the capacitor metal layer.

20. An integrated circuit, comprising:
a substrate;
a first metal layer and a second metal layer located over the substrate at a same horizontal level;
a capacitor including the first metal layer and a four layer dielectric stack located on the first metal layer, the four layer dielectric stack including:
a first silicon oxide layer on the first metal layer;
a silicon oxynitride layer on the first silicon oxide layer;
a second silicon oxide layer on the silicon oxynitride layer; and
a silicon nitride layer on the second silicon oxide layer; and
the capacitor further including a capacitor metal layer disposed on the silicon nitride layer, wherein the capacitor metal layer and the silicon nitride layer have a first lateral dimension in a first direction and the first silicon oxide layer, silicon oxynitride layer, and second silicon oxide layer have a second lateral dimension in the first direction, the second layer dimension greater than the first lateral dimension.

21. The integrated circuit of claim 20, wherein a thickness of the silicon nitride layer is thicker than a thickness of the silicon oxynitride layer which is thicker than a thickness of the first silicon oxide layer and a thickness of the second silicon oxide layer.

* * * * *